United States Patent
Kucheyev et al.

(10) Patent No.: US 10,896,804 B2
(45) Date of Patent: Jan. 19, 2021

(54) PLANARIZATION, DENSIFICATION, AND EXFOLIATION OF POROUS MATERIALS BY HIGH-ENERGY ION BEAMS

(71) Applicant: Lawrence Livermore National Security, LLC, Livermore, CA (US)

(72) Inventors: Sergei Kucheyev, Oakland, CA (US); Swanee Shin, Emeryville, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 323 days.

(21) Appl. No.: 15/661,645

(22) Filed: Jul. 27, 2017

(65) Prior Publication Data

US 2019/0035602 A1    Jan. 31, 2019

(51) Int. Cl.
*H01J 37/305* (2006.01)
*H01J 37/30* (2006.01)
*B01J 13/00* (2006.01)

(52) U.S. Cl.
CPC ......... *H01J 37/305* (2013.01); *B01J 13/0091* (2013.01); *H01J 37/3007* (2013.01); *H01J 2237/08* (2013.01); *H01J 2237/1202* (2013.01); *H01J 2237/30488* (2013.01); *H01J 2237/316* (2013.01); *H01J 2237/3151* (2013.01)

(58) Field of Classification Search
CPC .. B01J 13/0091; B01J 13/0095; H01J 37/305; H01J 37/3007
USPC ..................................................... 216/56, 66
See application file for complete search history.

(56) References Cited

U.S. PATENT DOCUMENTS

| | | | |
|---|---|---|---|
| 6,087,729 A * | 7/2000 | Cerofolini | C08F 292/00 257/759 |
| 2004/0213985 A1* | 10/2004 | Lee | B01D 67/0009 428/315.7 |
| 2005/0197689 A1* | 9/2005 | Molaei | A61F 2/86 623/1.13 |
| 2006/0000798 A1* | 1/2006 | Legras | B01D 67/0034 216/56 |
| 2009/0080592 A1 | 3/2009 | Arsenlis et al. | |
| 2015/0065597 A1* | 3/2015 | Furuyama | B29C 67/20 521/182 |
| 2016/0009049 A1* | 1/2016 | Stoltenberg | B32B 9/045 428/137 |
| 2018/0245205 A1* | 8/2018 | Salomon | B82B 1/005 |

OTHER PUBLICATIONS

Wikipedia, The Free Encyclopedia; "Nanofoam" via https://en.wikipedia.org/wiki/Nanofoam; pp. 1-3; 2019.*

(Continued)

*Primary Examiner* — Binh X Tran
(74) *Attorney, Agent, or Firm* — Harness, Dickey & Pierce, P.L.C.

(57) ABSTRACT

A method and system for providing at least one of planarization, densification, and exfoliation of a porous material using ion beams. The method may use an ion beam generator to generate an ion beam, the ion beam having energy above 0.1 MeV. The ion beam generator may irradiate the surface of a porous material with the ion beam to produce at least one of planarization, densification, and exfoliation of the porous material.

10 Claims, 5 Drawing Sheets

(56) References Cited

OTHER PUBLICATIONS

D. R. Rolison, R. W. Long, J. C. Lytle, A. E. Fischer, C. P. Rhodes, T. M. McEvoy, M. E. Bourga, A. M. Lubers, "Multifunctional 3D nanoarchitectures for energy storage and conversion", Chem. Soc. Rev., vol. 38, 2009, pp. 226-252.

Houria Kabbour, T. F. Baumann, J. H. Satcher, Jr., A. Saulnier, and C. C. Ahn, "Toward New Candidates for Hydrogen Storage: High-Surface-Area Carbon Aerogels", Chem. Mater., vol. 18, No. 26, 2006, 3 pages.

Geza Toth, J. Malkin, N. Halonen, J. Palosaari, J. Juuti, H. Jantunen, K. Kordas, W. G. Sawyer, R. Vajtai, and P. M. Ajayan, "Carbon-Nanotube-Based Electrical Brush Contacts", Adv. Mater., vol. 21, 2009, pp. 2054-2058.

S. P. Hotaling, "Ultra-low density aerogel optical applications", J. Mater. Res., vol. 8, No. 2, Feb. 1993, 4 pages.

S. Charnvanichborikarn, S. J. Shin, M. A. Worsley, and S. O. Kucheyev, "Tailoring properties of carbon-nanotube-based foams by ion bombardment", Appl. Phys. Lett., No. 101, 103114 (2012), 5 pages.

S. O. Kucheyev, Y. M. Wang, A. V. Hamza, and M. A. Worsley, "Light-ion-irradiation-induced thermal spikes in nanoporous silica", J. Phys. D: Appl. Phys., No. 44, 085406 (2011), 5 pages.

S.O. Kucheyev, A.V. Hamza, and M.A. Worsley, "Ion-beam-induced stiffening of nanoporous silica," Journal of Physics D: Applied Physics 42, 182003 (2009); 6 pages.

S. Charnvanichborikarn, M. A. Worsley, S. J. Shin, and S. O. Kucheyev, "Heavy-ion-induced modification of structural and mechanical properties of carbon-nanotube aerogels," Carbon 57, 2013, pp. 310-316.

M.A. Worsley, S.O. Kucheyev, J.H. Satcher, Jr., A.V. Hamza, and T.F. Baumann, "Mechanically robust and electrically conductive carbon nanotube foams," Appl. Phys. Lett., No. 94, 073115 (2009). 4 pages.

S.O. Kucheyev, A.V. Hamza, J.H. Satcher, Jr., and M.A. Worsley, "Depth-sensing indentation of low-density brittle nanoporous solids," Acta Mater. 57, (2009), pp. 3472-3480.

J.C. Ye, S. Charnvanichborikarn, M.A. Worsley, S.O. Kucheyev, B.C. Wood, and Y.M. Wang, Carbon, "Enhanced electrochemical performance of ion-beam-treated 3D graphene aerogels for lithium ion batteries," Carbon 85, (2015) pp. 269-278.

Timothy G. Leong et al. "Three-Dimensional Fabrication at Small Size Scales," Small, vol. 6, No. 7, (2010), pp. 792-806.

L. Mahadevan, S. Rica, "Self-organized Origami," Science, vol. 307, Mar. 18, 2005, p. 1740.

S. O. Kucheyev and A. V. Hamza, Appl. Phys. Rev.—Focused Review, "Condensed hydrogen for thermonuclear fusion", Journal of Applied Physics, No. 108, 091101 (2010), 28 pages.

F. Perez, J. D. Colvin, M. J. May, S. Charnvanichborikarn, S. O. Kucheyev, T. E. Felter, and K. B. Fournier, "High-power laser interaction with low-density C—Cu foams," Physics of Plasmas, vol. 22, 2015, 8 pages.

R. W. Pekala, J. C. Farmer, C. T. Alviso, T. D. Tran, S. T. Mayer, J. M. Miller, and B. Dunn, "Carbon aerogels for electrochemical applications", J. Non-Cryst. Solids, vol. 225, 1998, pp. 74-80.

\* cited by examiner

| Ion | Energy (MeV) | $R_p$ (µm) | $E_e$ (eV/Å) | $E_n$ (eV/Å) |
|---|---|---|---|---|
| $^{20}$Ne | 1.0 | 10.2 | 98 | 1.8 |
| $^{20}$Ne | 2.0 | 15.3 | 131 | 1.0 |
| $^{20}$Ne | 3.8 | 22.0 | 171 | 0.6 |
| $^{40}$Ar | 3.8 | 18.0 | 186 | 2.7 |
| $^{132}$Xe | 3.8 | 9.9 | 200 | 34.4 |
| $^{132}$Xe | 0.5 | 1.3 | 130 | 98.8 |

PLANARIZATION, DENSIFICATION, AND EXFOLIATION OF POROUS MATERIALS BY HIGH-ENERGY ION BEAMS

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to systems and methods for planarization, densification, and exfoliation of various types of porous materials using high energy ion beams.

BACKGROUND

This section provides background information related to the present disclosure which is not necessarily prior art.

Aerogels (AGs) represent a broad family of porous materials with typical porosities greater than about 80%. These materials have an open-cell structure of nanoligaments made of (often curved) nanosheets, nanorods, or chains of nanoparticles. These nanoligaments may be interconnected into a macroscopic three-dimensional porous assembly. Conventional sol-gel-derived nanoporous silica and carbon are prototypical AG materials.

Current and potential applications of AGs include lightweight optical components, electrochemical devices, hydrogen storage, catalytic supports, compliant electrical contacts, energy absorbing structures, and laser targets for thermonuclear fusion and high-energy density physics (HEDP) research. Some of these applications call for monolithic (rather than powdered) AG parts with well defined shapes and surface topography.

The net shaping of AGs by presently practiced subtractive manufacturing techniques has proven to be challenging. Mold casting of AGs has limitations associated with mold geometries, as well as issues with non-uniform foam shrinkage. Additional challenges with mold casting of AGs relate to the chemical compatibility of molds, demolding, and the formation of surface "skin" layers. For example, previous attempts to make light-weight mirrors by mechanical planarization (polishing) of silica AGs have had limited success. Problems stem from the general incompatibility of AGs with liquids. Meniscus forces result in the collapse of AG pores on wetting and/or drying. Mechanical machining of AGs is further complicated by poorly understood fracture behavior of nanoporous solids, particularly in the low-density regime.

In view of the foregoing described limitations, there is a need for new processing methods for nanoporous materials.

SUMMARY

This section provides a general summary of the disclosure, and is not a comprehensive disclosure of its full scope or all of its features.

In one aspect the present disclosure relates to a method for providing at least one of planarization, densification, and exfoliation of a porous material using ion beams. The method may comprise using an ion beam generator to generate an ion beam with energy above 100 keV. The method may further involve irradiating the surface of a porous material with the ion beam to produce at least one of planarization, densification, and exfoliation of the porous material.

In another aspect the present disclosure relates to a system for providing at least one of planarization, densification, and exfoliation of a porous material using ion beams. In one implementation the system may comprise an ion beam generator to generate an ion beam with energy above 100 keV. The system may also comprise a controller which moves at least one of the porous material or the ion beam in a raster scan pattern to irradiate the surface of the porous material to produce at least one of planarization, densification, and exfoliation of the porous material.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

The present disclosure relates to systems and methods for controlled doping, planarization, and densification of low-density nanoporous aerogels ("AGs"). The systems and methods described herein involve bombardment of nanofoams, for example nanoporous AGs, with energetic ions. The bombardment produces cylindrical plasma tracks along their trajectories and explosive ballistic collisions at the end of ion range. The present disclosure, using as an example silica AGs, demonstrates that medium-dose ion bombardment leads to a major reduction in surface roughness. This in turn yields mirror-like surfaces after subsequent metallization.

Figure 1:
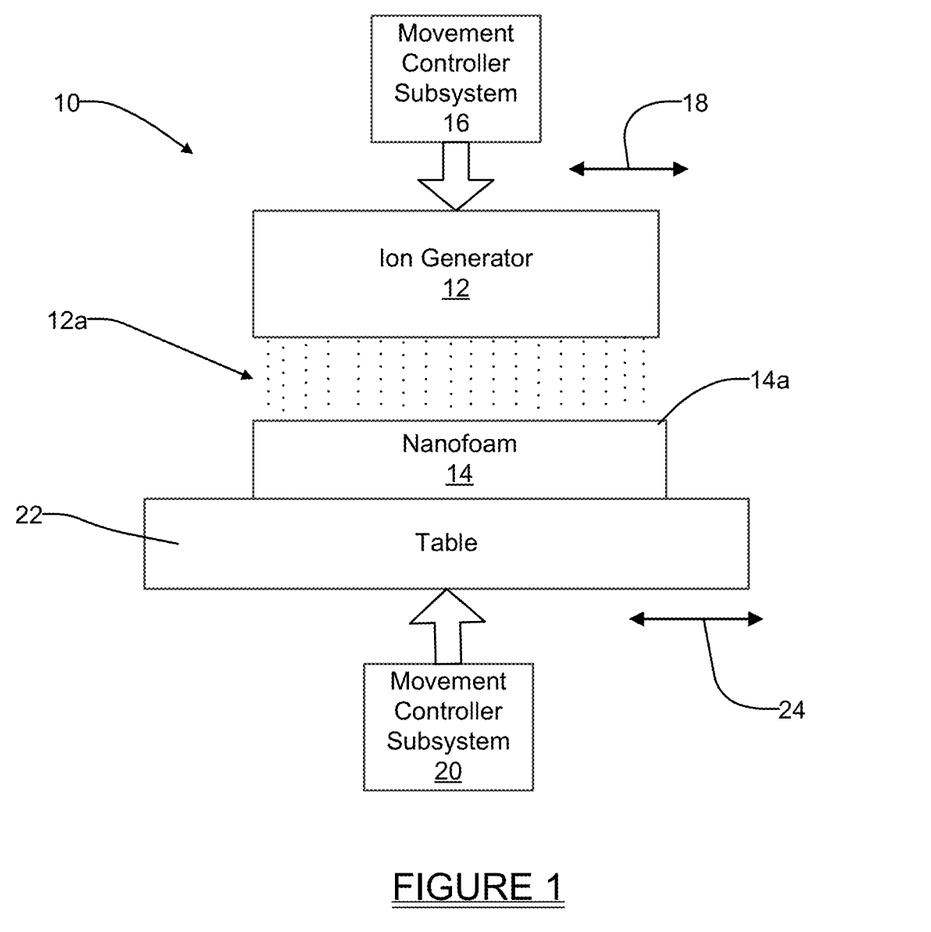
FIG. 1 is a high-level diagram of the system in accordance with one embodiment of the present disclosure that may be used to implement planarization, densification, and exfoliation of porous materials using high energy ion beams to produce significantly improved smoothing of surfaces.

Referring to FIG. 1, there is shown a high-level illustration of a system 10 used to enable an ion beam generator 12 to perform ion-beam smoothing of a rough surface 14a of a nanofoam 14. The ion beam generator 12 may be used to bombard the surface 14a of a nanofoam, for example a nanoporous aerogel 14, with ions 12a. For relatively small nanofoams, for example with areas less than possibly six inches by six inches (15.24 cm×15.24 cm), a suitable movement controller subsystem 16 (e.g., electrostatic or magnetic beam scanning system for ion beam movement along two axes) may be used to move the ion beam 12a in a suitable pattern, for example a raster scanned pattern, so that ions uniformly bombard the surface 14a of the nanofoam 14. The rate of movement of the ion beam, for example along the directional axis 18 may be tailored to minimize beam-induced thermal heating of the nanofoam 14. If the nanofoam 14 is larger than about six inches by six inches, then it may be preferable to move the nanofoam 14 in addition to ion beam rastering. In that case, a movement controller subsystem 20 may be provided which moves a table 22 on which the nanofoam 14 is present along two axes in a desired movement pattern (e.g., raster scanned pattern), as indicated by an arrow 24.

The ion-beam smoothing efficiency may be controlled by the electronic energy loss of ions rather than by conventional ballistic sputtering and re-deposition processes, which are typically used for ion-beam-induced planarization and shaping of full-density materials. Irradiation typically also results in sub-surface foam shrinkage of the nanofoam 14 that leads to surface exfoliation with increasing ion dose. These three interrelated phenomena, i.e., planarization, densification and exfoliation, have significant technological implications for AG planarization, the fabrication of graded-density foams, rapid material removal via radiation-induced surface exfoliation, and AG-based meso-origami.

Figure 2A:
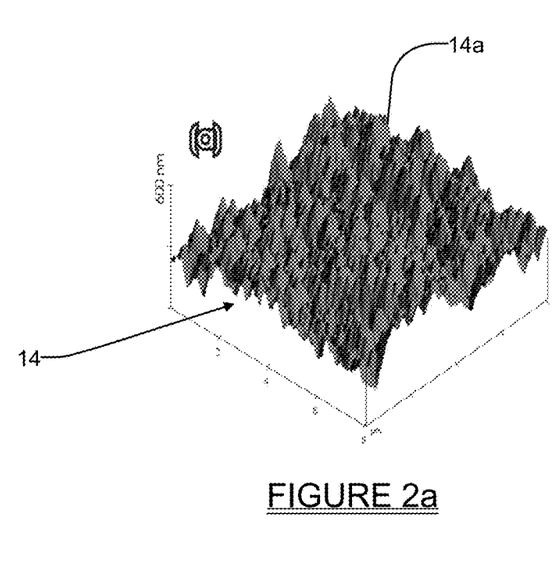
FIGS. 2a and 2b show an untreated nanofoam surface and a treated nanofoam surface, respectively, using the system of FIG. 1.
Figure 2B:
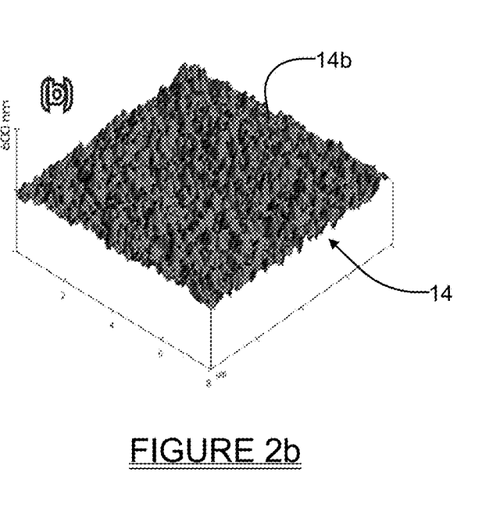

FIGS. 2a and 2b show an untreated nanofoam surface 14a (FIG. 2a) and a treated nanofoam surface 14b. FIGS. 2a and 2b show atomic force microscope (AFM) images of AG surfaces 14a and 14b, respectively, before and after bombardment with 3.8 MeV Ne ions to a dose of $2 \times 10^{15}$ cm$^{-2}$. Ion-beam-induced smoothing is clearly evident from a comparison of these two images. It can also be seen that ion bombardment has resulted in the flattening of protrusions (FIG. 2b) on the initially relatively rough fracture surface 14a (FIG. 2a). The AG monolith after irradiation may exhibit a densified web-like surface "coating." This web-like morphology is characteristic for all the irradiation conditions used in testing the system 10. In contrast, cross-sectional scanning electron microscope (SEM) imaging of ion irradiated AG monoliths prepared by fracturing along planes perpendicular to sample surface did not reveal any detectable ion-beam-induced changes in nanofoam morphology or ligament shapes and sizes. Hence, the ion-beam-induced modification of AG ligament morphology is mostly limited to the monolith surface.

Figure 3:
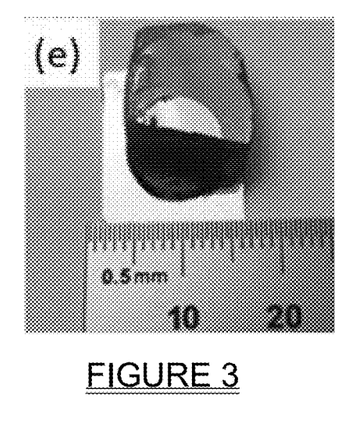
FIG. 3 shows an optical microscopy image of an aerogel bombarded with 3.8 MeV $^{132}$Xe ions to a dose of $5 \times 10^{14}$ cm$^{-2}$.

FIG. 3 shows an optical image of an AG sample that was bombarded with 3.8 MeV $^{132}$Xe ions to a dose of $5 \times 10^{14}$ cm$^{-2}$ through a circular mask. Ion irradiation was followed by sputter coating with an ~15-nm-thick layer of Pt and subsequently fractured along the diameter of the circular mask. FIG. 3 clearly illustrates that the irradiated area exhibits a mirror-like surface. In contrast, without prior ion bombardment, AG fracture surfaces sputter-coated with metals are poorly reflective. This is consistent with challenges encountered in previous attempts to fabricate metal-coated AG-based light-weight reflectors from as-fractured AG surfaces.

Figure 4:
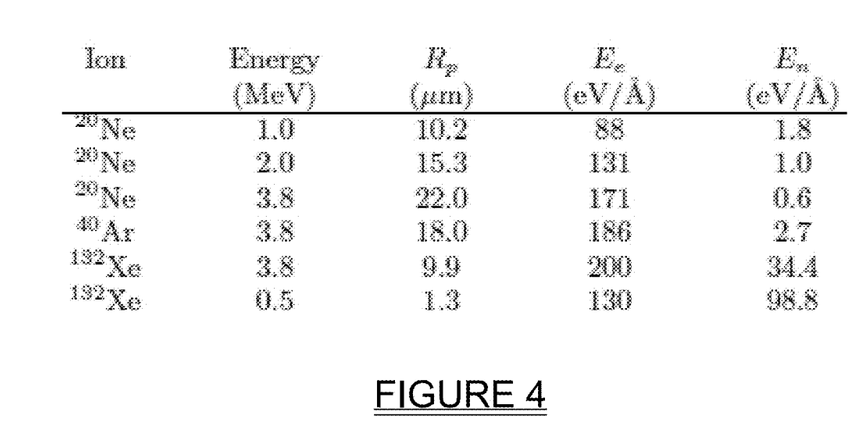
FIG. 4 is a table showing ion radiation conditions using the system of FIG. 1, and where given values of the projected ion range ($R_p$) in the aerogel material and electronic ($E_e$) and nuclear ($E_n$) stopping powers in full-density silica nanoligaments at the sample surface.

The co-inventors have observed such a phenomenon of radiation induced decrease in surface roughness for all the bombardment conditions from the table of FIG. 4. The table of FIG. 4 provides values of the projected ion range ($R_p$) in the aerogel monolith and electronic ($E_e$) and nuclear ($E_n$) stopping powers in full density silica nanoligaments at the sample surface 14a. In all cases, bombardment was done at room temperature with rastered ion beams with a constant beam flux of $10^{12}$ cm$^{-2}$ s$^{-1}$ incident along the direction normal to the sample surface 14a.

Figure 5:
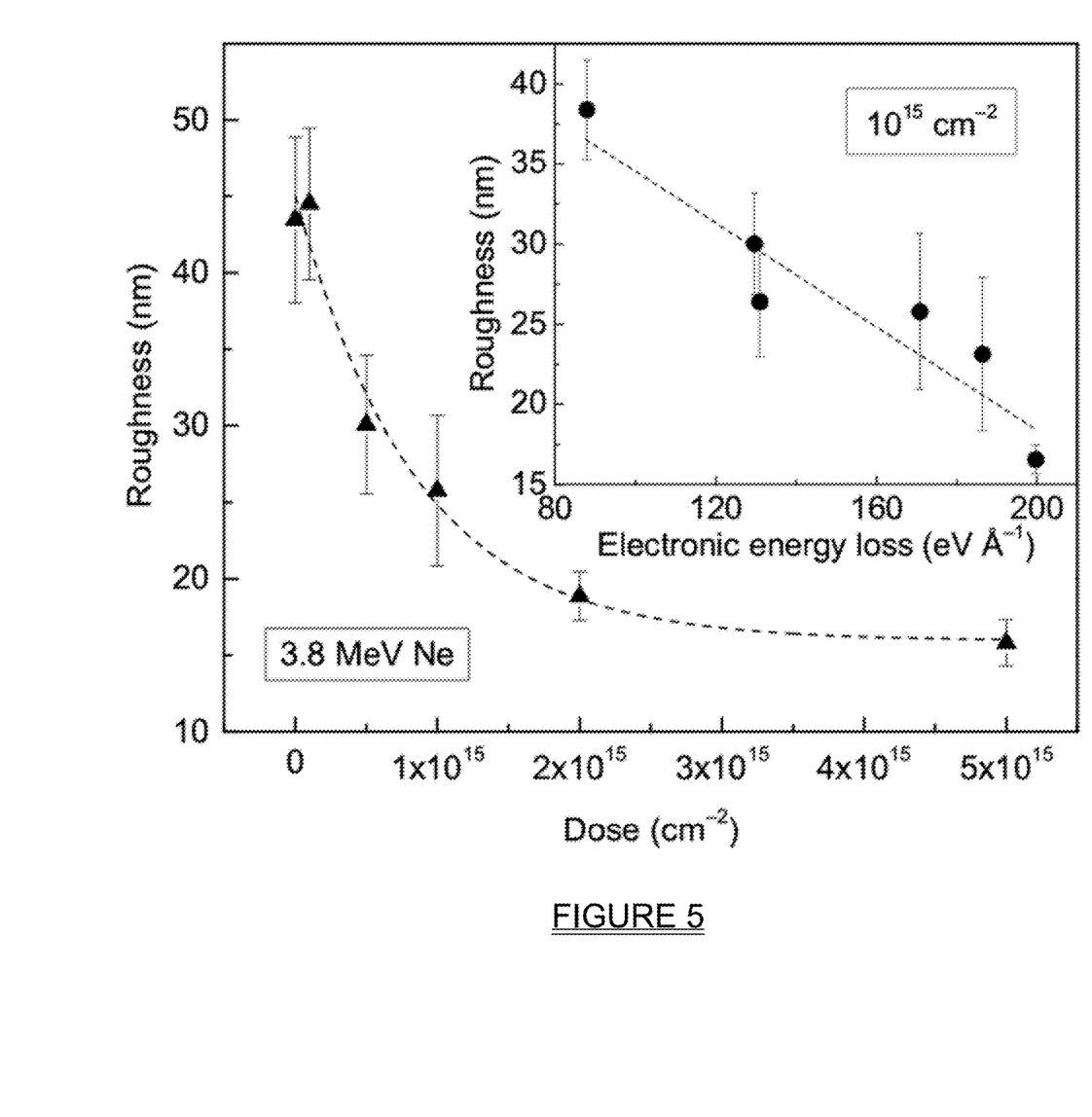
FIG. 5 is a graph showing the dose dependence of the AFM-measured surface roughness of silica aerogels irradiated with 3.8 MeV $^{20}$Ne ions, and where the dashed line is a fit with the first order (exponential) decay equation, and where the inset plots the surface roughness as a function of electronic energy loss for silica aerogels irradiated with different ions listed in the table of FIG. 4 to a dose of $10^{15}$ cm$^{-2}$, and where the dashed line in the inset is a linear fit.

FIG. 5 shows the ion dose dependence of the AFM-measured root mean square surface roughness (R) of AGs irradiated with 3.8 MeV Ne ions. It is seen that, with increasing ion dose, R reduces close-to-exponentially: $R = (R0 - R^\infty) \exp(-\sigma\phi) + R^\infty$, where $\phi$ is the ion dose, $\sigma$ is the effective cross section of ion-beam-induced planarization, R0 is the R value before bombardment, and $R^\infty$ is the saturation value for high ion doses. The dashed line in FIG. 5 is a result of fitting with the above equation, yielding a $\sigma$ of ~10-15 cm-2, R0=45 nm, and $R^\infty$=15 nm. Such an exponential dependence is expected when each impact flattens a small area a (of ~10-15 cm-2, corresponding to a diameter of 0.4 nm) on the sample surface, changing R from R0 to $R^\infty$, with subsequent ion impacts resulting in negligible further smoothing.

Although radiation processing of nanomaterials is a rapidly developing field, applications to nanoporous materials is an area that remains largely unexplored. The effects of particle irradiation on the surface morphology of nanoporous solids have been largely unexplored until the work represented by the present disclosure. This is in contrast to the field of ion-beam-induced planarization of surfaces of full density materials via an interplay of processes of ballistic sputtering, material redeposition, surface diffusion, and viscous flow that has received much attention for the past several decades.

Further considering the physical mechanisms of the ion-beam-induced planarization revealed by FIGS. 2b and 5, a question may arise as to whether the planarization phenomenon is caused by ballistic processes within collision cascades or by intense electronic excitation along ion trajectories. To answer this, measurements were made of R of AGs bombarded under different conditions (see the table of FIG. 4) characterized by a broad range of nuclear and electronic energy loss in AG ligaments. The inset in FIG. 5 plots R as a function of electronic energy loss in AG nanoligaments irradiated with different mass ions to the same total dose of $10^{15}$ cm$^{-2}$. It reveals a close-to-linear dependence of R on electronic energy loss. Importantly, R does not scale with either nuclear energy loss or total (nuclear and electronic combined) losses, suggesting that intense electronic excitation around ion tracks is responsible for the ion-beam-induced planarization phenomenon.

Figure 6:
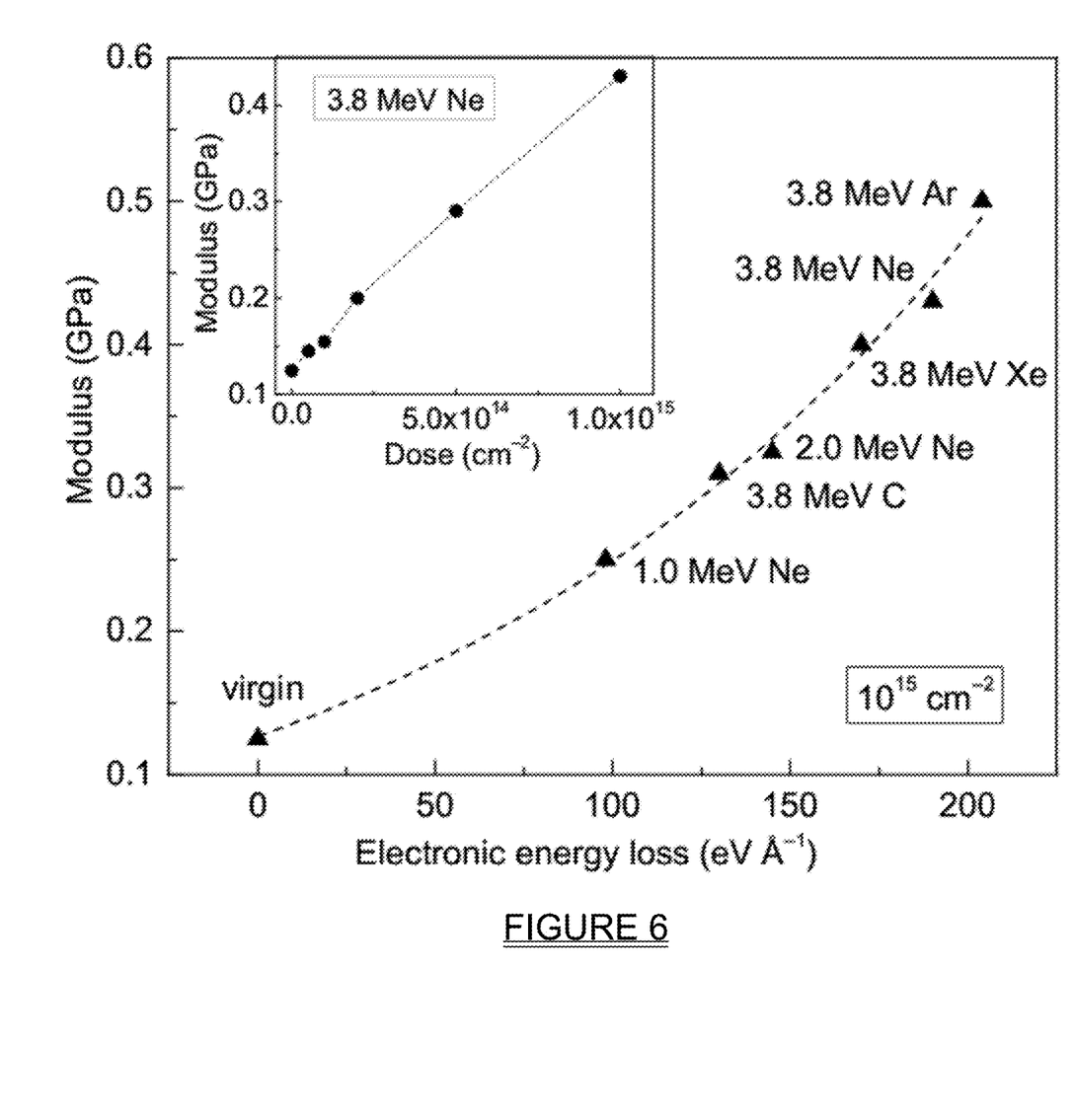
FIG. 6 is a graph that shows the elastic modulus as a function of electronic energy loss for silica aerogels irradiated with different ions from the table of FIG. 4 to a dose of $10^{15}$ cm$^{-2}$, and where the inset shows the dose dependence of the elastic modulus of silica aerogels irradiated with 3.8 MeV $^{20}$Ne ions.

In addition to surface planarization, ion bombardment leads to AG densification, which has previously been reported for both silica and carbon AGs and high-density nanoporous silica Vycor glass. In the present disclosure, we report radiation-induced foam densification by measuring the AG elastic modulus (E), which is very sensitive to changes in the AG density. Indeed, the E of the silica AGs such as described here depends strongly super-linearly (with an exponent of ~5!) on the monolith density. The inset in FIG. 6 shows that the E of AGs increases with dose for bombardment with 3.8 MeV Ne ions. The dependence of E on the electronic energy loss for samples irradiated with different ions to the same dose of $10^{15}$ cm$^{-2}$ is also shown in FIG. 6. It reveals that E scales super-linearly with the electronic stopping power. Note that, due to a super-linear dependence of E on the density, such a large 4 times) increase in E revealed by FIG. 6 corresponds to only a 40% increase in the monolith density (with an assumption of no density-independent ion-beam-induced changes to E).

Radiation-induced densification of AGs is inevitably accompanied by the development of mechanical stress, and more particularly stress-induced surface exfoliation for samples irradiated above certain threshold doses. Surface exfoliation may potentially be used as a unique way of rapid material removal in AG machining. Moreover, with irradiation assisted control of near-surface stresses in AGs, ion bombardment of AGs could be developed as a method similar to self-folding and/or rolling-up of patterned layers often referred to as meso-origami. The relaxation of in-built stress in the AG layer after exfoliation results in de-formation, leading to the formation of three-dimensional nanoporous structures such as tubes or spirals or more complex shapes.

Planarization, densification, and exfoliation of porous materials by ion bombardment from the ion generator 12 may be performed with ions with kinetic energy above about 100 keV with ion masses ranging from $^1$H to $^{238}$U, and not only by using the irradiation conditions shown in FIG. 4. However, the important irradiation parameter is the electronic energy loss of bombarding ions. In order to rationalize the choice of irradiation conditions, it will be helpful to briefly describe the fundamental radiation processes in solids. When an energetic ion impinges on the surface of a solid, it undergoes a succession of ballistic collisions (nuclear energy loss) with the stationary atoms of the target. The energetic ion gradually loses its energy in these collisions with target electrons. This may be termed the "electronic energy loss". For heavy ions with energies of several MeV and larger that are generated by the ion generator 12, energy loss in electronic collisions can be so large that cylindrical plasma regions (thermal spikes) are produced along ion trajectories. Additionally, explosive ballistic collisions may be produced at the end of ion tracks.

Examples of the planarization, densification, and exfoliation described in this disclosure were given for monolithic nanoporous silica AGs that were prepared by base-catalyzed hydrolysis of tetramethylorthosilicate Si(OCH$_3$). The AG density was ~0.34 g cm$^{-3}$ (corresponding to ~15% of the full density silica). All experiments described in this disclosure were performed on optically transparent fracture surfaces prepared by propagating cracks along straight scratches made on AG surfaces.

The systems and methods described in the present disclosure could be used for the fabrication of AG-based lightweight optics. High-energy ion bombardment of AGs could be used as a method similar to now conventional self-folding and/or rolling-up of patterned layers often referred to as meso-origami. These meso-origami methods typically involve the fabrication of two-dimensionally-patterned thin films with in-built mechanical stresses. The deformation of the film is constrained by a substrate. When such a film is released from the substrate (for example, by chemical etching of the substrate), relaxation of in-built stresses in the film results in deformation, leading to the formation of three-dimensional structures such as simple tubes and spirals or more complex shapes. The smallest dimensions of resultant top-down origami structures are lithographically-limited, and only full-density materials are amenable to these methods. The ion bombardment method of densification and exfoliation described in this disclosure allows one to craft origami with nanoporous materials and to extend the meso-origami to nanoscale dimensions.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure. Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms.

These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A method for providing at least one of planarization, densification, and exfoliation of a porous material using ion beams, the method comprising:
   providing a porous material including at least one of a nanofoam and an aerogel;
   using an ion beam generator to generate an ion beam with energy level above 100 keV; and
   irradiating a surface of the porous material with only ions from the ion beam to modify a ligament morphology of the at least one of nanofoam and aerogel through control over an electronic energy loss of ions of the ion beam, so as to produce at least one of planarization, densification, and exfoliation of the porous material.

2. The method of claim 1, wherein the ion beam comprises Ne, Ar, Kr, or Xe ions with a beam energy above 1 MeV.

3. The method of claim 1, wherein an ion irradiation dose provided by the ion beam generator is above $1 \times 10^{14}$ cm$^{-2}$.

4. The method of claim 1, wherein the porous material comprises a nanofoam.

5. The method of claim 1, wherein the porous material comprises an aerogel.

6. The method of claim 1, wherein the porous material comprises a silica aerogel.

7. The method of claim 1, further comprising moving the ion beam or the porous material in a raster pattern when irradiating the porous material with ions.

8. The method of claim 1, wherein the ion beam generator generates ions having energies above 0.1 MeV with ion masses from $^1$H to $^{238}$U.

9. A method for providing at least one of planarization of a surface of at least one of a nanofoam and an aerogel material using ion beams, the method comprising:
   providing a porous material including at least one of a nanofoam and an aerogel material:
   using an ion beam generator to generate an ion beam with energy above 100 keV and with ion masses from $^1$H to $^{238}$U; and
   controlling an energy of the ion beam while irradiating a surface of the at least one of a nanofoam and an aerogel material with only ions from the ion beam to modify a ligament morphology of the at least one of a nanofoam and an aerogel material, through control over an electronic energy loss of ions of the ion beam, so as to produce a controlled planarization of the surface, the controlled planarization representing a controlled reduction in surface roughness of the surface of the at least one of a nanofoam and an aerogel material.

10. A method for providing densification of at least one of a nanofoam and an aerogel material using ion beams, the method comprising:
   providing at least one of a nanofoam and an aerogel material:
   using an ion beam generator to generate an ion beam with energy above 100 keV, and with ion masses from $^1$H to $^{238}$U; and
   controlling an energy of the ion beam while irradiating the at least one of a nanofoam and an aerogel material with only ions from the ion beam to modify a ligament morphology of the at least one of a nanofoam and an aerogel material through an electronic energy loss of the ions of the ion beam, which modification of the ligament morphology produces a controlled amount of densification of the at least one of a nanofoam and an aerogel material.

* * * * *